United States Patent
Mis

[19]

[11] Patent Number: 5,902,686
[45] Date of Patent: May 11, 1999

[54] METHODS FOR FORMING AN INTERMETALLIC REGION BETWEEN A SOLDER BUMP AND AN UNDER BUMP METALLURGY LAYER AND RELATED STRUCTURES

[75] Inventor: Joseph Daniel Mis, Cary, N.C.

[73] Assignee: MCNC, Research Triangle Park, N.C.

[21] Appl. No.: 08/754,637

[22] Filed: Nov. 21, 1996

[51] Int. Cl.$^6$ .............................. B32B 15/00; B32K 1/20
[52] U.S. Cl. .................. 428/629; 148/528; 228/180.22; 228/232; 228/254
[58] Field of Search .................................. 428/629, 647, 428/620, 666, 660, 601; 148/537, 518, 528; 228/180.22, 232, 254

[56] References Cited

U.S. PATENT DOCUMENTS

| | | | |
|---|---|---|---|
| 3,887,760 | 6/1975 | Krieger et al. ........................ | 174/68.5 |
| 4,921,157 | 5/1990 | Dishon et al. ........................ | 228/124 |
| 4,950,623 | 8/1990 | Dishon .................................. | 437/183 |
| 5,048,744 | 9/1991 | Chang et al. ......................... | 228/123 |
| 5,152,451 | 10/1992 | Darveaux et al. .................. | 228/180.2 |
| 5,160,409 | 11/1992 | Moore et al. ........................ | 156/656 |
| 5,162,257 | 11/1992 | Yung ..................................... | 437/183 |
| 5,167,361 | 12/1992 | Liebman et al. .................... | 228/180.2 |
| 5,293,006 | 3/1994 | Yung ..................................... | 174/261 |
| 5,327,013 | 7/1994 | Moore et al. ........................ | 257/772 |
| 5,407,121 | 4/1995 | Koopman et al. .................. | 228/206 |
| 5,415,944 | 5/1995 | Kazem-Goudarzi et al. ........ | 428/567 |
| 5,470,787 | 11/1995 | Greer .................................... | 437/183 |
| 5,499,754 | 3/1996 | Bobbio et al. ....................... | 228/42 |
| 5,617,989 | 4/1997 | Kelzer .................................. | 228/125 |
| 5,629,564 | 5/1997 | Nye, III et al. ...................... | 257/762 |
| 5,641,113 | 6/1997 | Somaki et al. ...................... | 228/180.22 |
| 5,767,010 | 6/1998 | Mis et al. ............................. | 438/614 |

FOREIGN PATENT DOCUMENTS

| | | |
|---|---|---|
| 0 469 216 A1 | 7/1990 | European Pat. Off. . |
| WO 96/30933 | 3/1996 | WIPO . |
| WO 96/31905 | 3/1996 | WIPO . |

OTHER PUBLICATIONS

PCT Search Report; PCT/US 97/18157; International filing date: Sep. 30, 1997.

*Assembly Technology In China*, Electronic Packaging & Production, A Cahners Publication, vol. 35, No. 1, Jan. 1995, pp. 40 and 42.

*Primary Examiner*—John J. Zimmerman
*Attorney, Agent, or Firm*—Alston & Bird, LLP

[57] ABSTRACT

Method for forming a solder bump on a substrate include the steps of forming an under bump metallurgy layer on a substrate, forming a solder bump on the under bump metallurgy layer, and forming an intermetallic portion of the under bump metallurgy layer adjacent the solder bump. In particular, the solder bump has a predetermined shape and this predetermined shape is retained while forming the intermetallic portion of the under bump metallurgy layer. This predetermined shape preferably has a flat surface opposite the substrate thus providing a uniform thickness of solder during the formation of the intermetallic portion. Related structures are also disclosed.

23 Claims, 4 Drawing Sheets

METHODS FOR FORMING AN INTERMETALLIC REGION BETWEEN A SOLDER BUMP AND AN UNDER BUMP METALLURGY LAYER AND RELATED STRUCTURES

FIELD OF THE INVENTION

The present invention relates to the field of microelectronics and more particularly to solder bumps for microelectronic devices.

BACKGROUND OF THE INVENTION

High performance microelectronic devices often use solder balls or solder bumps for electrical and mechanical interconnection to other microelectronic devices. For example, a very large scale integration (VLSI) chip may be electrically connected to a circuit board or other next level packaging substrate using solder balls or solder bumps. This connection technology is also referred to as "Controlled Collapse Chip Connection—C4" or "flip-chip" technology, and will be referred to herein as "solder bumps".

A significant advance in this technology is disclosed in U.S. Pat. No. 5,162,257 to Yung entitled "Solder Bump Fabrication Method" and assigned to the assignee of the present invention. In this patent, an under bump metallurgy is formed on the microelectronic substrate including contact pads, and solder bumps are formed on the under bump metallurgy opposite the contact pads. The under bump metallurgy between the solder bumps and the contact pads is converted to an intermetallic which is resistant to etchants used to etch the under bump metallurgy between solder bumps. Accordingly, the base of the solder bumps is preserved.

In many circumstances, it may be desired to provide a solder bump on the substrate at a location remote from the contact pad and also form an electrical connection between the contact pad and the solder bump. For example, a microelectronic substrate may be initially designed for wire bonding with the contact pads arranged around the outer edge of the substrate. At a later time it may be desired to use the microelectronic substrate in an application requiring solder bumps to be placed in the interior of the substrate. In order to achieve the placement of a solder bump on the interior of the substrate away from the respective contact pad, an interconnection or redistribution routing conductor may be necessary.

U.S. Pat. No. 5,327,013 to Moore et al. entitled "Solder Bumping of Integrated Circuit Die" discloses a method for forming a runner and solder bump on an integrated circuit die. This method includes forming a terminal of an electrically conductive, solder-wettable composite material. The terminal includes a bond pad overlying the passivation layer remote from a metal contact and a runner that extends from the pad to the metal contact. A body of solder is reflowed onto the bond pad to form a bump bonded to the pad and electrically coupled through the runner.

Notwithstanding the above mentioned references, there continues to exist a need in the art for methods of producing redistribution routing conductors and solder bumps efficiently and at a reduced cost.

SUMMARY OF THE INVENTION

It is therefore an object of the present invention to provide improved solder bump structures and methods.

It is another object of the present invention to provide improved redistribution routing conductors and related methods.

These and other objects are provided according to the present invention by methods of forming solder bumps and structures without the need to form and remove solder dams. In particular, a sacrificial oxide layer is used to maintain the shape of the solder bump or structure so that solder dams are not required.

According to one aspect of the present invention, a method for forming solder bumps includes the steps of forming an under bump metallurgy layer on a substrate, forming a solder bump on the under bump metallurgy layer, and forming an intermetallic portion of the under bump metallurgy layer adjacent the solder bump. In particular, the solder bump has a predetermined shape, and this predetermined shape is maintained during the step of forming the intermetallic portion of the under bump metallurgy. The solder bump preferably has a relatively flat surface opposite the substrate both before and after forming the intermetallic portion of the under bump metallurgy layer.

The intermetallic portion of the under bump metallurgy layer can be formed by heating the solder bump above its liquidus temperature while maintaining an oxide layer on the solder bump. This oxide layer prevents the solder from flowing thus maintaining the predetermined shape of the solder bump. The oxide layer may be naturally occurring or enhanced by heating the solder in the presence of oxygen. Because the oxide layer prevents the solder from flowing across the under bump metallurgy layer, there is no need for a solder dam, and the surface of the under bump metallurgy layer can be wettable to the solder. The elimination of the solder dam eliminates the steps of forming the solder dam and later removing the solder dam. Elimination of the solder dam also allows the formation of solder bumps with finer resolution because pattern blow-out is reduced.

The oxide layer can be maintained during the step of forming the intermetallic by not using flux or other reducing agents. By not using flux, the solder can be heated well above its liquidus temperature because charred flux will not be produced. In other words, the use of flux may reduce the temperature used to form the intermetallic. Higher temperatures reduce the time required to form the intermetallic thus reducing process time.

The intermetallic portion of the under bump metallurgy layer may include a constituent of the under bump metallurgy and a constituent of the solder. In particular, a lead tin solder and an under bump metallurgy including a layer of copper adjacent the solder bump will combine to produce an intermetallic portion including copper and tin. This intermetallic portion can resist etchants used to remove the under bump metallurgy thus reducing undercutting of the solder bump.

The step of forming the under bump metallurgy layer may include the steps of forming a chromium layer on the substrate, forming a phased layer of chromium and copper on the chromium layer, and forming a copper layer on the phased layer. In addition, the step of forming the chromium layer can be preceded by the step of forming a titanium layer on the substrate. This under bump metallurgy layer thus provides sufficient adhesion for the solder bump while protecting the contact pad and the passivation layer. The step of forming the solder bump may include the steps of forming a patterned photoresist layer on the under bump metallurgy layer, plating solder on exposed portions of the under bump metallurgy layer, and removing the patterned photoresist layer.

The solder bump may include an elongate portion and an enlarged width portion. By maintaining the predetermined shape of the solder bump while forming the intermetallic portion of the under bump metallurgy layer, a sufficiently thick layer of solder can be maintained over the elongate portion despite the tendency of solder to flow toward the enlarged width portion due to differences in internal pressures. Accordingly, the intermetallic portion of the under bump metallurgy layer can be adequately formed along both the elongate and enlarged width portions. Adequate resistance to etchants used to remove the under bump metallurgy is thus provided along the elongate portion.

The step of forming the intermetallic region of the under bump metallurgy layer can be followed by the step of reflowing the solder bump so that the surface of the solder bump opposite the substrate takes on a domed shape. In particular, this reflowing step may include heating the solder bump above its liquidus temperature while removing an oxide layer therefrom. The oxide layer can be removed by applying flux or other reducing agents. Alternately, the solder bump can be given a fluxless pretreatment. If the solder bump includes elongate and enlarged width portions as discussed above, this reflow step allows solder to flow from the elongate portion to the enlarged width portion due to differences in internal pressure thus forming a raised solder bump. By removing the portions of the under bump metallurgy layer not covered by the solder bump prior to the reflowing step, no solder dam is required to contain the solder because the solder will not wet to the passivation layer of the substrate.

The methods of the present invention thus allow the fabrication of solder bumps and structures without requiring a solder dam. The elimination of the solder dam thus reduces the number of processing steps while allowing the fabrication of solder bumps with reduced dimensions. In addition, by maintaining a flat surface of the solder structure during the step of forming the intermetallic, a uniform layer of solder can be maintained over narrow portions of solder structures thus ensuring complete formation of the intermetallic along these narrow portions. Accordingly, the yield and reliability of these structures can be increased. Furthermore, the elimination of flux from the step of forming the intermetallic allows the intermetallic to be formed at a higher temperature thus reducing process time.

DETAILED DESCRIPTION

Figure 7:
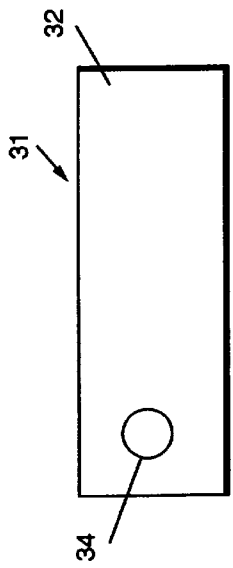
FIGS. 7–12 are top views of a microelectronic substrate at various steps during the fabrication of a redistribution routing conductor corresponding respectively to FIGS. 1–6.

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Figure 12:
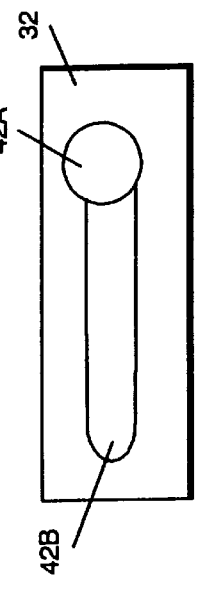
Figure 6:
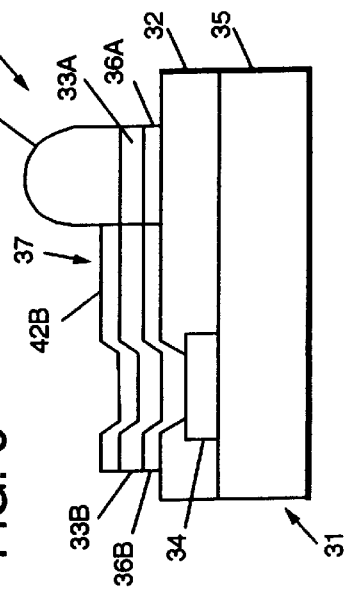

The invention relates to a microelectronic structure 31 including a redistribution routing conductor and a raised solder bump, as shown from the side in FIG. 6 and as shown from the top in corresponding FIG. 12. The microelectronic structure includes a contact pad 34 and passivation layer 32 on a substrate 35. The redistribution routing conductor 37 and solder bump 41 each include respective portions of under bump metallurgy layer 36 and solder layer 42. Furthermore, an intermetallic region 33 may be provided between the under bump metallurgy layer 36 and solder layer 42.

The redistribution routing conductor 37 includes a relatively elongate solder portion 42B on a respective elongate under bump metallurgy portion 36B. The solder bump 41 includes an enlarged width solder portion 42A on a respective enlarged width under bump metallurgy portion 36A. Preferably, the elongate solder portion 42B is relatively thin while the enlarged width solder portion 42A is raised, as shown in FIG. 6. The intermetallic region 33 preferably includes a constituent of the under bump metallurgy and a constituent of the solder.

Accordingly, the solder bump 41 can be located at a point on the substrate relatively distant from the contact pad 34 with the redistribution routing conductor 37 providing an electrical connection therebetween. This arrangement provides the advantage that a substrate having a layout with a contact pad 34 at a first location can have an associated solder bump at a second location. This can be particularly useful, for example, when a substrate has a layout with contact pads arranged for wire bonding, and it is desired to use the substrate in a flip-chip application. This solder bump and redistribution routing conductor can be fabricated simultaneously, as described below with regard to FIGS. 1–12. While the redistribution routing conductor 37 can be straight as shown, it may also include bends and curves. Furthermore, the solder bump 41 may be circular as shown or it can have other shapes, such as rectangular.

Figure 1:
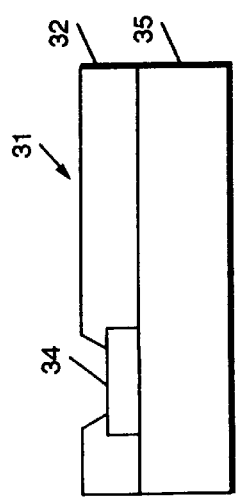
FIGS. 1–6 are cross sectional views of a microelectronic substrate at various steps during the fabrication of a redistribution routing conductor according to the present invention.

The solder bump 41 and the redistribution routing conductor 37 are preferably formed simultaneously. FIGS. 1–6 are cross-sectional side views of microelectronic structures at various steps of fabrication, while FIGS. 7–12 are corresponding top views of the same microelectronic structures. The microelectronic structure 31 initially includes a passivation layer 32 and an exposed contact pad 34 on a substrate 35, as shown in FIGS. 1 and 7.

The substrate 35 can include a layer of a semiconducting material such as silicon, gallium arsenide, silicon carbide, diamond, or other substrate materials known to those having skill in the art. This layer of semiconducting material can in turn include one or more electronic devices such as transistors, resistors, capacitors, and/or inductors. The contact pad 34 may comprise aluminum, copper, titanium, an intermetallic including combinations of the aforementioned metals such as AlCu and $AlTi_3$, or other materials known to those having skill in the art. This contact is preferably connected to an electronic device in the substrate.

The passivation layer 32 can include polyimide, silicon dioxide, silicon nitride, or other passivation materials known to those having skill in the art. As shown, the passivation layer 32 may cover top edge portions of the contact pad 34 opposite the substrate 35, leaving the central portion of the contact pad 34 exposed. As will be understood by those having skill in the art, the term substrate may be defined so as to include the passivation layer 32 and contact pad 34 of FIGS. 1 and 7.

Figure 2:
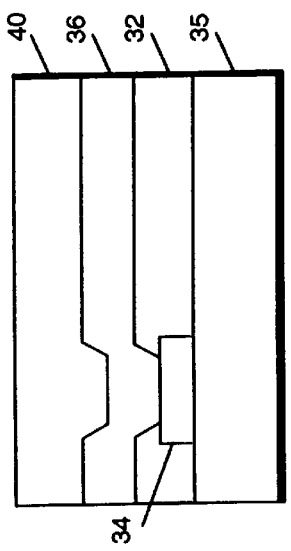

An under bump metallurgy layer 36 is formed on the passivation layer to provide a connection between the solder bump and the contact pad 34 and to provide a plating electrode, as shown in FIG. 2. The under bump metallurgy layer 36 also protects the contact pad 34 and passivation layer 32 during subsequent processing steps, and provides a surface to which the solder will adhere. The under bump metallurgy layer preferably includes a chromium layer on the passivation layer 32 and contact pad 34; a phased chromium/copper layer on the chromium layer; and a copper layer on the phased layer. This structure adheres to and protects the passivation layer 32 and contact pad 34, and also provides a base for the plated solder which follows.

The under bump metallurgy layer may also include a titanium barrier layer between the substrate and the chromium layer as disclosed in U.S. Pat. No. 5,767,010 to Mis et al. entitled "Solder Bump Fabrication Methods and Structure Including a Titanium Barrier Layer," a continuation of U.S. Pat. No. application Ser. No. 08/407,196, now abandoned, and assigned to the assignee of the present invention. This titanium barrier layer prevents the formation of residues on the passivation layer which may lead to shorts between solder bumps and redistribution routing conductors. The titanium layer can be easily removed from the passivation layer without leaving significant residues.

Various under bump metallurgy layers are disclosed, for example, in U.S. Pat. No. 4,950,623 to Dishon entitled "Method of Building Solder Bumps", U.S. Pat. No. 5,162,257 to Yung entitled "Solder Bump Fabrication Method", and U.S. Pat. application Ser. No. 08/407,196 to Mis et al. entitled "Solder Bump Fabrication Methods and Structures Including a Titanium Barrier Layer" filed on Mar. 20, 1995. Each of these references is assigned to the assignee of the present invention, and the disclosure of each is hereby incorporated in its entirety herein by reference.

Figure 8:
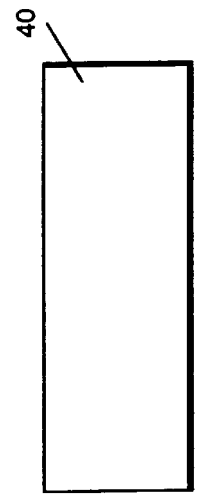
Figure 9:
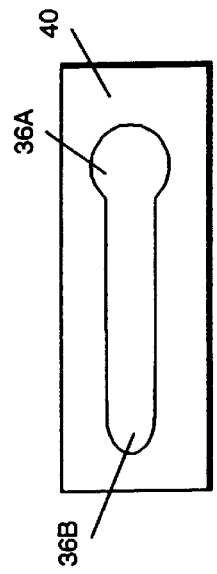
Figure 3:
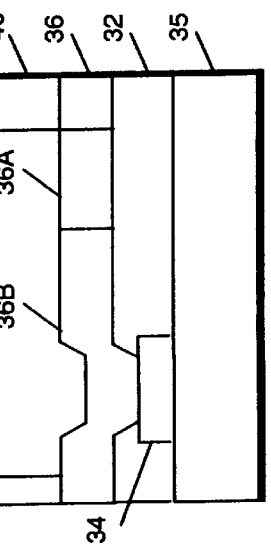

A mask layer 40 is then formed on the under bump metallurgy layer 36, as shown in FIGS. 2 and 8. This mask layer may be a photoresist mask or another mask known to those having skill in the art. As shown in FIGS. 3 and 9, the mask layer 40 is patterned to cover a first portion of the under bump metallurgy layer and to expose a second portion of the under bump metallurgy layer 36 on which the solder bump and redistribution routing conductor will be formed. More particularly, the second portion of the under bump metallurgy layer 36, which is not covered by the patterned mask layer, includes an enlarged width portion 36A and an elongate portion 36B.

Optionally, a solder dam can be formed on the under bump metallurgy layer 36. This solder dam may include a layer of a solder non-wettable material, such as titanium or chromium, on the under bump metallurgy layer 36. The solder dam can be used to contain the solder if a reflow step is performed prior to removing the first (exposed) portion of the under bump metallurgy layer 36 not covered by solder, as discussed below. The patterned mask layer 40 thus exposes a portion of the solder dam which can be removed thereby uncovering the second portion of under bump metallurgy layer 36 on which solder is plated.

Figure 10:
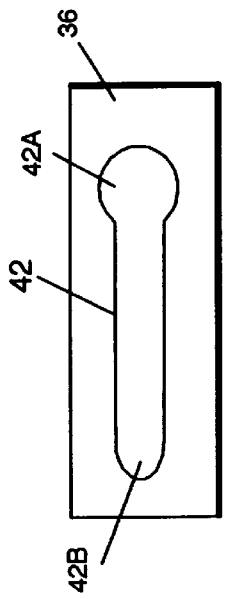
Figure 4:
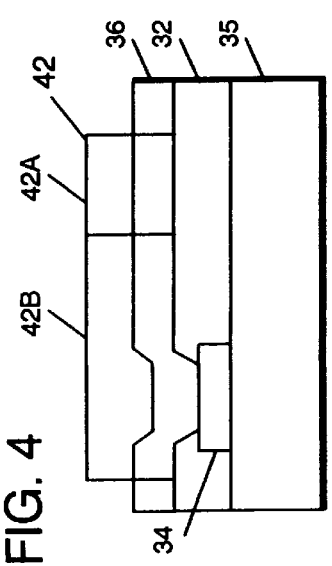

A solder layer 42 is preferably electroplated on the second portion of the under bump metallurgy layer 36, and the patterned mask layer 40 is removed, as shown in FIGS. 4 and 10. The solder can be electroplated by applying an electrical bias to the continuous under bump metallurgy layer 36 and immersing the microelectronic structure in a solution including lead and tin, as will be understood by those having skill in the art. This electroplating process allows solder layers to be formed simultaneously on a plurality of second portions of the under bump metallurgy layer 36. The solder will not plate on the mask layer 40. Alternatively, the solder can be applied by screen printing as a paste, by evaporation, by e-beam deposition, by electroless deposition or by other methods known to those having skill in the art. In addition, while lead-tin solder is used for purposes of illustration throughout the specification, other solders such as gold solder, lead-indium solder, or tin solder can be used as will be understood by those having skill in the art. The solder layer 42 includes an elongate portion 42B and an enlarged width portion 42A.

Upon forming the solder layer 42, an oxide layer will form naturally thereon. This oxide layer can be used to prevent the solder from flowing when heated above its liquidus temperature. This oxide layer can be enhanced by heating the solder layer 42 while exposing it to oxygen.

The solder layer 42 is then heated above its liquidus temperature in order to form an intermetallic region 33 of the under bump metallurgy layer 36 adjacent the solder bump. This intermetallic region 33 includes a constituent of the solder layer and a constituent of the under bump metallurgy, and resists etchants later used to remove portions of the under bump metallurgy not covered by the solder layer 42. In particular, a lead tin solder and an under bump metallurgy layer including a copper layer adjacent the solder layer can produce an intermetallic layer including $Cu_3Sn$. The intermetallic region 33 includes an elongate portion 33B and an enlarged width portion 33A.

By maintaining the oxide layer on the solder layer 42 during the step of forming the intermetallic region, the solder does not flow even though heated above its liquidus temperature. In particular, the solder can be heated above its liquidus temperature without applying flux or other reducing agents. Accordingly, there is no need to provide a solder dam to contain the solder during the step of forming the intermetallic region. In addition, a layer of solder of uniform thickness is maintained even though the solder layer includes both relatively narrow elongate and relatively wide enlarged width portions which might otherwise cause solder to flow from the elongate portions to the enlarged width portions as a result of differences in internal pressure due to surface tension.

Figure 5:
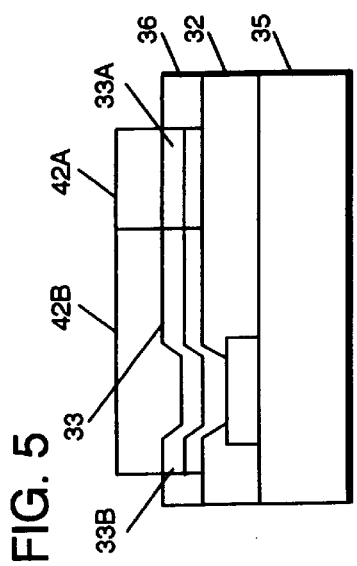

Accordingly, the solder layer 42 maintains a relatively flat surface opposite the substrate after forming the intermetallic region, as shown in FIG. 5. Adequate solder is thus provided for reaction with the under bump metallurgy layer over the entire region of the under bump metallurgy layer 36A–B which is plated with solder during the step of forming the intermetallic region, despite the tendency for solder to flow from narrow regions to wider regions when heated above its liquidus temperature. Otherwise, solder may be drawn away from the relatively narrow elongate portions 42A before completely reacting with the under bump metallurgy layer resulting in insufficient masking of the elongate portions when etching the under bump metallurgy layer.

Furthermore, the elimination of the solder dam allows the fabrication of solder layers with increased resolution. This increase in resolution is due to the fact that the photolithographic patterning of a solder dam may result in pattern blow-out because undercutting of the mask layer can cause the dimensions of the solder dam to be larger than those of the original photolithographic pattern. The elimination of the solder dam also eliminates the need for a step of removing the solder dam upon completion of the solder structure.

The elimination of flux from the heating step eliminates the need for a flux clean. Because the flux is not a consideration during the heating step, the step of forming the intermetallic region can be accomplished by heating the solder to a temperature significantly higher than the liquidus temperature of the solder thus reducing the time required to completely form the intermetallic region. High temperature operations can be more difficult when using flux because the flux may char making it more difficult to remove.

After forming the intermetallic region 33 of the under bump metallurgy layer, portions of the under bump metallurgy layer not covered by the solder layer can be removed by selective etching, as shown in FIGS. 6 and 12. The intermetallic region 33 is resistant to etchants commonly used to remove the under bump metallurgy layer 36. Accordingly, this intermetallic region reduces undercutting of the solder during the step of removing the first portion of the under bump metallurgy layer not covered by solder, as discussed in U.S. Pat. No. 5,162,257 to Yung entitled "Solder Bump Fabrication Method" and assigned to the assignee of the present invention.

The under bump metallurgy layer 36 can include a copper layer adjacent the solder structure, and the solder can be a lead-tin solder. Accordingly, the step of heating the solder above its liquidus temperature will cause the solder to react with the copper to form an intermetallic region 33 adjacent the solder structure, and this intermetallic region 33 can include $Cu_3Sn$. This intermetallic region does not readily react with etchants commonly used to remove under bump metallurgy layers thereby reducing undercutting of the solder structure.

The solder layer 42 is then preferably used as a mask to selectively etch the first portions of the under bump metallurgy layer 36 not covered by solder. A chemical etchant can be used to etch the under bump metallurgy layer 36 preferentially with respect to the solder portions 42 and the intermetallic region 33. Accordingly, no additional masking step is required to pattern the under bump metallurgy layer. Stated in other words, the formation of mask layer 40 is the only masking step required to selectively expose the second portion of the under bump metallurgy layer 36 during the plating step (FIGS. 3 and 9), and remove the first portions of the under bump metallurgy layer 36 not covered by solder after the plating step (FIGS. 6 and 12).

After removing the portions of the under bump metallurgy layer 36 not covered by solder, the microelectronic structure 31 can be heated with a reducing agent such as flux. Alternately, the solder can be given a fluxless pretreatment prior to heating as discussed in U.S. Pat. No. 4,921,157 to Dishon et al. entitled "Fluxless Soldering Process", U.S. Pat. No. 5,407,121 to Koopman et al. entitled "Fluxless Soldering of Copper", and U.S. Pat. No. 5,499,754 to Bobbio et al. entitled "Fluxless Soldering Sample Pretreating System." Each of these patents is assigned to the assignee of the present invention, and each of these patents is hereby incorporated herein in its entirety by reference. Accordingly, the solder flows from the elongate solder portion 42B to the enlarged width solder portion 42A as a result of internal pressure differences thereby forming a raised solder bump at the enlarged width solder portion 42A, as shown in FIGS. 6 and 12. The solder does not flow beyond the remaining portions of the under bump metallurgy 36 because the solder does not wet to the passivation layer 32. The use of a reducing agent during this heating step removes the oxide layer on the surface of the solder thus allowing the solder to flow.

The solder will flow when heated above its liquidus temperature (approximately 299° C. for solder having 90% lead and 10% tin) in the presence of a reducing agent, and this process is commonly referred to as solder reflow. Because the solder need only be heated above its liquidus temperature to flow, higher temperatures which are more likely to char the flux are unnecessary. The uncharred flux can thus be removed using conventional cleaning techniques. During reflow, the surface tension of the solder creates a relatively low internal pressure in the enlarged width solder portion 42A over the relatively wide geometry provided for the solder bump, and a relatively high internal pressure in the elongate solder portion 42B over the relatively narrow geometry provided for the redistribution routing conductor.

In order to equalize this internal pressure differential, solder flows from the elongate solder portion 42B to the enlarged width solder portion 42A.

Accordingly, the solder forms a raised solder bump at the enlarged width solder portion 42A and a relatively thin layer of solder at the elongate solder portion 42B over the redistribution routing conductor. When the solder is cooled below its liquidus temperature, it solidifies maintaining its shape including the raised solder bump and the thin layer of solder over the redistribution routing conductor. This phenomenon is discussed in U.S. application Ser. No. 08/416,619 to Rinne et al. entitled "Methods For Forming Integrated Redistribution Routing Conductors And Solder Bumps And Structures Formed Thereby" filed Apr. 5, 1995. This application is hereby incorporated herein in its entirety by reference.

The method of the present invention relies on differences in the surface-tension induced internal pressure of the reflowed (liquid) solder to form a thin layer of solder at the elongate solder portion 42B and a raised solder bump at the enlarged width solder portion 42A. The internal pressure P of a liquid drop of solder can be determined according to the formula:

$$P=2T/r,$$

where T is the surface tension of the liquid solder, and r is the radius of the drop.

Where liquid solder is on a flat wettable surface such as the under bump metallurgy layer, the formula becomes:

$$P=2T/r'.$$

In this formula, r' is the apparent radius of the liquid solder, and the apparent radius is the radius of the of the arc (radius of curvature) defined by the exposed surface of the solder. The apparent radius is dependent on the width of the underlying solder wettable layer such as the second portion of the under bump metallurgy layer which is in contact with the solder. Accordingly, the internal pressure of a reflowed solder structure is inversely proportional to the width of the second portion of the under bump metallurgy in contact with the solder. Stated in other words, a solder portion having a relatively wide under bump metallurgy portion will have a relatively low internal pressure while a solder portion on an elongate (relative narrow) under bump metallurgy portion will have a relatively high internal pressure. The internal pressures will equalize when the apparent radii of the elongate solder portion 42B and the enlarged width solder portion 42A are approximately equal.

Figure 11:
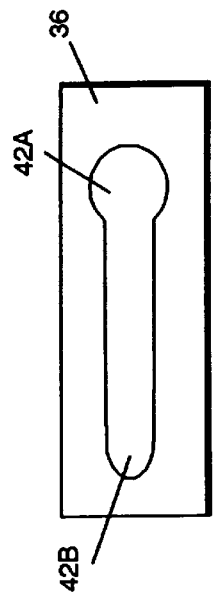

Accordingly, when the solder layer 42 with a uniform level illustrated in FIGS. 5 and 11 is heated above its liquidus temperature, solder flows from the elongate solder portion 42B to the enlarged width solder portion 42A until each portion has approximately the same apparent radius thereby forming a raised solder bump.

Alternately, a solder dam can be provided on the under bump metallurgy layer as discussed above. Accordingly, the solder layer 42 of FIGS. 5 and 11 can be reflowed prior to removing the portions of the under bump metallurgy not covered by solder. The solder dam prevents the solder from spreading beyond the elongate 36B and enlarged width 36A portions of the under bump metallurgy layer 36. The solder dam and portions of under bump metallurgy not covered by solder can then be removed.

As an example, a first portion of the under bump metallurgy layer 36 is covered by a mask layer 40. A second portion of the under bump metallurgy layer 36 can be exposed having an elongate portion 36B that an be 150 $\mu$m wide and 500 $\mu$m long, and having a circular enlarged width portion 36A with a 500 $\mu$m diameter (or width), as shown in FIGS. 3 and 9. A uniform 35 $\mu$m high solder layer 42 can then be electroplated on the second portion of the under bump metallurgy layer 36 including elongate portion 36A and enlarged width portion 36B, as shown in FIGS. 4 and 10. This solder can be 90% lead and 10% tin. After removing the mask layer 40, the solder is heated above its liquidus temperature (approximately 299° C.). Because an oxide layer is maintained on the solder, it will not flow.

The liquid solder is contained on the second portion 36A–B of the solder wettable under bump metallurgy layer by the oxide layer thereon, and a relatively flat surface is maintained opposite the substrate. Accordingly, an intermetallic region is formed adjacent the solder. The portions of the under bump metallurgy not covered by the solder are removed and the solder can be heated with a reducing agent to form the raised solder bump of FIG. 6.

Because the solder structure has varying widths, the internal pressure of the solder structure is not consistent when the height is uniform. In particular, the internal pressure of the elongate solder portion 42B is relatively high (approximately $1.283 \times 10^4$ Pa or 1.86 psi) and the internal pressure of the enlarged width solder portion 42A is relatively low (approximately $3.848 \times 10^3$ Pa or 0.558 psi) at the original solder height. Accordingly, solder flows from the elongate solder portion 42B to the enlarged width solder portion 42A until the internal pressures equalize, thereby forming a raised solder bump at the enlarged width solder portion 42A, as shown in FIGS. 6 and 12.

In this example, equilibrium can be obtained at an internal pressure of approximately $3.4 \times 10^3$ Pa (0.493 psi). At equilibrium, the elongate solder portion 42B can be approximately 10 $\mu$m high and the enlarged width solder portion can be approximately 130 $\mu$m high, and both portions can have a radius of curvature of approximately 281 $\mu$m. Accordingly, a two level solder structure can be provided with a single masking step. When cooled, this structure solidifies while maintaining its form. In addition, the elongate solder portion 42B with a solder height of 10 $\mu$m is sufficient to mask the respective elongate under bump metallurgy layer portion 36B when removing the first portion of the under bump metallurgy layer not covered by solder. The enlarged width portion of the solder structure may have a width (or diameter if the enlarged width portion is circular) of at least 2 times a width of the elongate portion of the solder structure in order to ensure that the solder bump formed by the method described above is sufficiently raised relative to the elongate solder portion to provide an adequate connection to a printed circuit board.

By preventing the solder from flowing during the formation of the intermetallic region, relatively narrow elongate portions can be provided. For example, redistribution routing conductors can be fabricated with a 70 $\mu$m wide and 3400 $\mu$m long elongate portion connected to a circular enlarged width portion having a 125 $\mu$m diameter. In addition, redistribution routing conductors can be fabricated with a 25 $\mu$m wide and 800 $\mu$m long elongate portion connected to a circular enlarged width portion having a 500 $\mu$m diameter. These redistribution routing conductors can be fabricated according to the present invention thus providing a reliable elongate portion which has a sufficiently formed intermetallic region to withstand the removal of the excess portions of the under bump metallurgy and to maintain a sufficient layer of solder thereon.

As shown in FIGS. 13–24, the methods of the present invention can also be used to provide a solder bump on a microelectronic substrate without a redistribution routing conductor. In particular, a microelectronic structure 51 can include a solder bump 62 as shown from the side in FIG. 18 and as shown from the top in FIG. 24. The microelectronic structure includes a contact pad 54 and a passivation layer 52 on a substrate 55. The solder bump 62 is formed on an under bump metallurgy layer 56 with an intermetallic region 53 therebetween. In particular, the solder bump 62 can be formed on the under bump metallurgy layer 56 opposite the contact pad 54 thus eliminating the redistribution routing connector.

Figure 19:
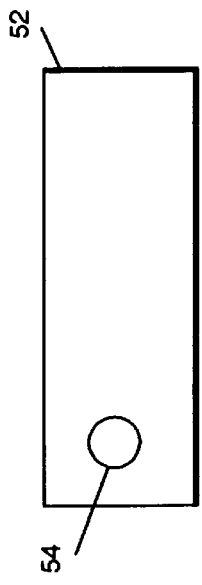
FIGS. 19–24 are top views of a microelectronic substrate at various steps during the fabrication of a solder bump corresponding respectively to FIGS. 13–18.
Figure 20:
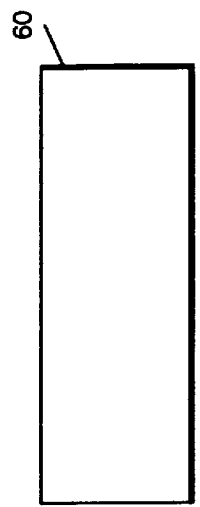
Figure 13:
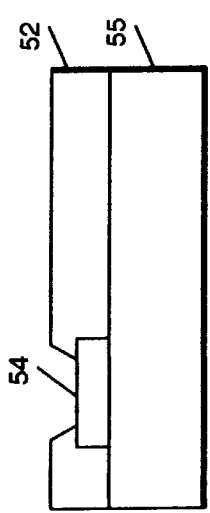
FIGS. 13–18 are cross sectional views of a microelectronic substrate at various steps during the fabrication of a solder bump according to the present invention.
Figure 14:
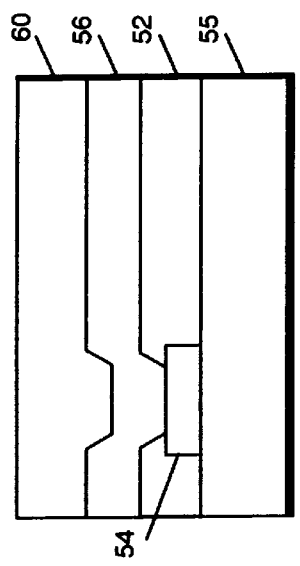

The steps of forming the solder bump 62 are illustrated in FIGS. 13–24. As discussed above, the microelectronic structure initially includes a passivation layer 52 and an exposed contact pad 54 on a substrate 55, as shown in FIGS. 13 and 19. An under bump metallurgy layer 56 and a photoresist mask layer 60 are formed on the passivation layer 52 and the contact pad 54, as shown in FIGS. 14 and 20. The substrate 55, the passivation layer 52, the contact pad 54, the under bump metallurgy layer 56, and the photoresist layer 60 can all be provided as discussed above with regard to FIGS. 1–12.

Figure 21:
Figure 15:
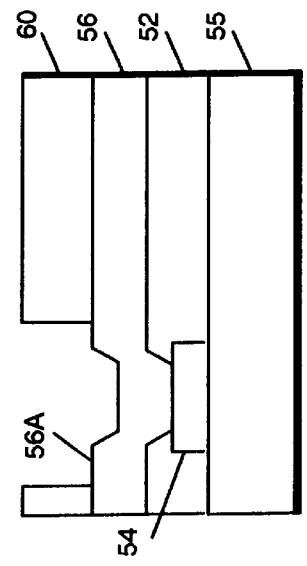
Figure 22:
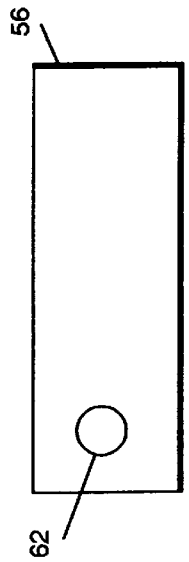
Figure 16:
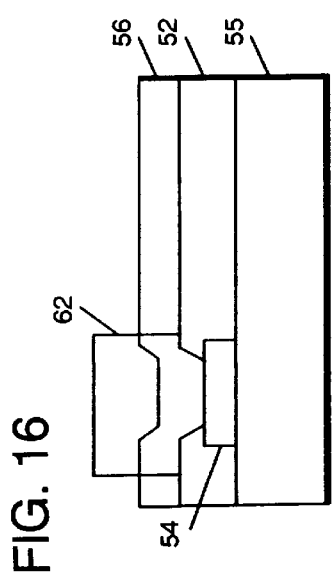

The mask layer 60 can be patterned to expose a portion 56A of the under bump metallurgy layer opposite the contact pad, as shown in FIGS. 15 and 21. Solder is then plated on the exposed portion 56A of the under bump metallurgy layer, and the mask layer 60 is removed as shown in FIGS. 16 and 22.

Figure 23:
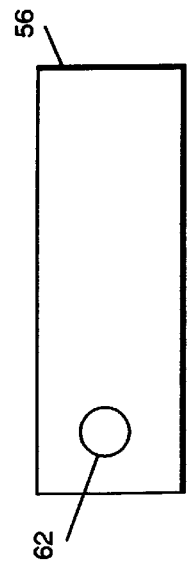
Figure 24:
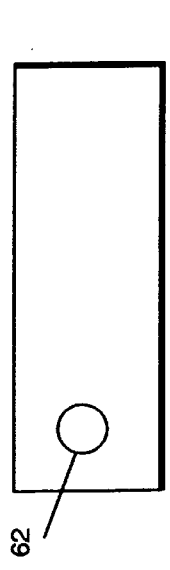
Figure 17:
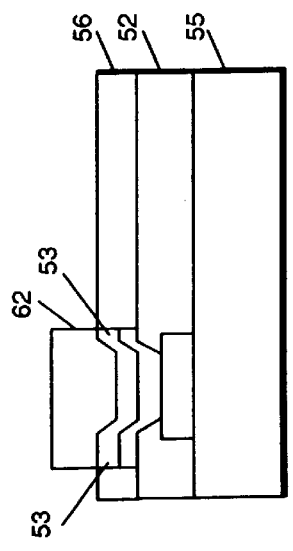
Figure 18:
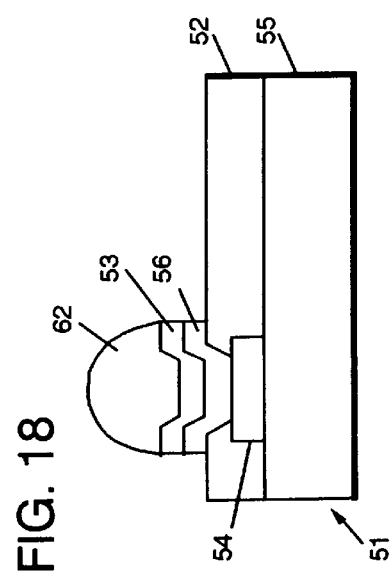

The solder bump 62 is then heated above its liquidus temperature (approximately 299° C. for solder with 90% lead and 10% solder) to form an intermetallic region 53 of the under bump metallurgy layer adjacent the solder bump 62. As shown in FIGS. 17 and 23, the step of forming the intermetallic region 53 is performed while retaining the shape of the solder bump 62. More particularly, the solder bump 62 maintains a relatively flat surface opposite the substrate during this heating step. As before, the shape of the solder bump can be maintained by maintaining an oxide layer on the surface of the solder. Accordingly, the oxide layer prevents the solder from spreading across the under bump metallurgy layer 56 despite the fact that the under bump metallurgy layer is wettable.

Accordingly, the solder bump can be fabricated without providing a solder dam on the under bump metallurgy layer. The elimination of the solder dam allows solder bumps with finer dimensions to be produced because pattern blow-out is reduced, as discussed above. The elimination of the solder dam also eliminates the need to later remove the solder dam.

By not using flux during this heating step to remove the oxide from the solder, there is no need to clean the flux off after the heating step. Furthermore, the elimination of flux thus allows the solder to be heated to higher temperatures thus decreasing the time required to form the intermetallic region. When using flux, the higher temperatures may cause the flux to char thus making it more difficult to remove.

The portions of the under bump metallurgy layer 56 not covered by the solder bump 62 can then be removed by etching while using the solder bump as a mask. The intermetallic region 53 is resistant to the etch thus reducing undercutting of the solder bump during this etch. The solder bump 62 can then be heated above its liquidus temperature in the presence of a reducing agent such as flux to form the spherical solder bump 62 shown in FIGS. 18 and 24. In particular, the solder bump does not flow beyond the remaining portion of the under bump metallurgy because the solder does not wet to the passivation layer 52. Alternately, a solder dam can be provided on the under bump metallurgy layer thus allowing the solder bump to be reflowed before removing the excess portions of the under bump metallurgy layer.

Typically, oxides are removed from solder bumps allowing the solder to flow when heated. By maintaining an oxide layer on a solder bump while forming an intermetallic region of an under bump metallurgy adjacent the bump, however, the solder bump can be maintained at a uniform level. Accordingly, a sufficient thickness of solder can be maintained across the solder bump to provide completion of the intermetallic region of the under bump metallurgy. In addition, the oxide layer prevents the solder from flowing across a wettable under bump metallurgy. A solder dam is thus not required to prevent the flow of solder.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A solder structure for a microelectronic substrate, said solder structure comprising:

an under bump metallurgy layer on said substrate;

a solder bump on said under bump metallurgy layer wherein said solder bump includes an oxide layer thereon opposite said under bump metallurgy layer; and an intermetallic portion of said under bump metallurgy layer disposed between said under bump metallurgy layer and said solder bump.

2. A solder structure according to claim 1 wherein a surface of said under bump metallurgy layer opposite said substrate is wettable to said solder bump.

3. A solder structure according to claim 1 wherein said intermetallic portion of said under bump metallurgy layer comprises a constituent of said under bump metallurgy and a constituent of said solder.

4. A solder structure according to claim 1 wherein said under bump metallurgy layer comprises:

a chromium layer on said substrate;

a phased layer of chromium and copper on said chromium layer opposite said substrate; and a copper layer on said phased layer opposite said chromium layer.

5. A solder structure according to claim 4 wherein said under bump metallurgy layer further comprises a layer of titanium between said substrate and said chromium layer.

6. A solder structure according to claim 1 wherein said solder bump includes an elongate portion and an enlarged width portion.

7. A solder structure according to claim 1 wherein said substrate includes an electrical contact having an exposed portion and wherein said solder bump electrically contacts said exposed portion of said electrical contact.

8. A method of forming a solder structure on a substrate, said method comprising the steps of:

forming an under bump metallurgy layer on said substrate;

forming a solder layer on said under bump metallurgy layer, wherein said solder layer includes an oxide layer thereon; and forming an intermetallic portion of said under bump metallurgy layer adjacent said solder layer by heating said solder layer while maintaining said oxide layer thereon.

9. The method of claim 8 wherein said step of forming said solder layer on said under bump metallurgy layer is preceded by the step of forming a patterned mask layer on said under bump metallurgy layer that exposes a portion of said under bump metallurgy layer, and said step of forming said solder layer on said under bump metallurgy layer includes the steps of forming said solder layer on said portion of said under bump metallurgy layer and then removing said patterned mask layer.

10. The method of claim 8 wherein said step of forming an intermetallic portion is followed by the step of reflowing said solder layer to form a solder bump.

11. The method of claim 8 wherein a surface of said under bump metallurgy layer opposite said substrate is wettable to said solder layer.

12. The method of claim 8 wherein said step of forming said under bump metallurgy layer comprises the steps of:

forming a chromium layer on said substrate;

forming a phased layer of chromium and copper on said chromium layer opposite said substrate; and forming a copper layer on said phased layer opposite said chromium layer.

13. The method of claim 12 wherein said step of forming said chromium layer is preceded by the step of forming a titanium layer on said substrate.

14. The method of claim 8 wherein said solder layer includes an elongate portion and an enlarged width portion.

15. The method of claim 8 wherein said solder layer has a flat surface opposite said substrate.

16. The method claim 8 wherein said intermetallic portion comprises a constituent of said under bump metallurgy layer and a constituent of said solder layer.

17. The method of claim 8 wherein said heating of said solder layer during said step of forming an intermetallic portion comprises heating said solder layer above the liquidus temperature of said solder layer for a period of time sufficient for said solder layer to react with said under bump metallurgy layer.

18. The method of claim 8 wherein said step of forming said intermetallic portion is followed by the steps of reducing said oxide layer and reflowing said solder layer to form a solder bump.

19. A method of forming a solder structure on a substrate, said method comprising the steps of:

forming an under bump metallurgy layer on said substrate, wherein said under bump metallurgy layer is wettable to solder;

forming a solder bump on a portion of said under bump metallurgy layer, wherein said solder bump includes an oxide layer thereon; and forming an intermetallic portion of said under bump metallurgy layer adjacent said solder bump by heating said solder bump above its liquidus temperature while maintaining said oxide layer on said solder bump.

20. The method of claim 19 wherein said step of forming said under bump metallurgy layer comprises the steps of:

forming a chromium layer on said substrate;

forming a phased layer of chromium and copper on said chromium layer opposite said substrate; and forming a copper layer on said phased layer opposite said chromium layer.

21. The method of claim 20 wherein said step of forming said chromium layer is preceded by the step of forming a titanium layer on said substrate.

22. The method of claim 19 wherein said solder bump includes an elongate portion and an enlarged width portion.

23. The method of claim 19 wherein said step of forming said intermetallic portion is followed by the steps of reducing said oxide layer and heating said solder bump above a liquidous temperature of said solder bump.

* * * * *

UNITED STATES PATENT AND TRADEMARK OFFICE
CERTIFICATE OF CORRECTION

PATENT NO. : 5,902,686
DATED : May 11, 1999
INVENTOR(S) : Mis

It is certified that error appears in the above-identified patent and that said Letters Patent is hereby corrected as shown below:

Column 11, line 46, after "bump" insert --, said intermetallic portion formed by heating said solder layer while maintaining said oxide layer on said solder bump--.

Signed and Sealed this

Ninth Day of November, 1999

Attest:

Q. TODD DICKINSON

Attesting Officer

Acting Commissioner of Patents and Trademarks